(12) United States Patent
Chiras et al.

(10) Patent No.: US 7,825,516 B2
(45) Date of Patent: Nov. 2, 2010

(54) FORMATION OF ALIGNED CAPPED METAL LINES AND INTERCONNECTIONS IN MULTILEVEL SEMICONDUCTOR STRUCTURES

(75) Inventors: Stefanie Ruth Chiras, Peekskill, NY (US); Michael Wayne Lane, Cortlandt Manor, NY (US); Sandra Guy Malhotra, Beacon, NY (US); Fenton Reed Mc Feely, Ossining, NY (US); Robert Rosenberg, Cortlandt Manor, NY (US); Carlos Juan Sambucetti, Croton on Hudson, NY (US); Philippe Mark Vereecken, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 295 days.

(21) Appl. No.: 10/316,484

(22) Filed: Dec. 11, 2002

(65) Prior Publication Data

US 2004/0113277 A1    Jun. 17, 2004

(51) Int. Cl.
 *H01L 23/532* (2006.01)
(52) U.S. Cl. ............... 257/774; 257/E23.144; 257/E23.167; 257/734; 257/522; 257/276; 257/760; 257/761; 257/762; 257/763; 257/764; 257/766; 257/767; 257/768
(58) Field of Classification Search ............. 257/774, 257/773, 734, 522, 276, 760–764, 766–768, 257/E23.167, E23.144
 See application file for complete search history.

(56) References Cited

U.S. PATENT DOCUMENTS

| | | | | |
|---|---|---|---|---|
| 5,604,156 A | * | 2/1997 | Chung et al. | 438/620 |
| 5,674,787 A | * | 10/1997 | Zhao et al. | 438/627 |
| 5,793,112 A | * | 8/1998 | Hasegawa et al. | 257/758 |
| 6,107,687 A | * | 8/2000 | Fukada et al. | 257/762 |
| 6,153,935 A | * | 11/2000 | Edelstein et al. | 257/773 |
| 6,184,138 B1 | * | 2/2001 | Ho et al. | 438/687 |
| 6,214,728 B1 | * | 4/2001 | Chan et al. | 438/678 |
| 6,251,786 B1 | * | 6/2001 | Zhou et al. | 438/692 |

(Continued)

FOREIGN PATENT DOCUMENTS

JP    2000-208511    *    7/2000

OTHER PUBLICATIONS

U.S. Appl. No. 09/361,573, filed Jul. 27, 1999, Hu et al., Titled Reduced Electromigration and Stressed Induced Migration of Cu Wires by Surface Coating.

*Primary Examiner*—Alexander O Williams
(74) *Attorney, Agent, or Firm*—Thomas A. Beck; Daniel P. Morris

(57) ABSTRACT

In integrated circuit technology; an electromigration and diffusion sensitive conductor of a metal such as copper and processing procedure therefore is provided, wherein, at a planarized chemical mechanical processed interfacing surface, the conductor metal is positioned in a region of a selectable low K eff dielectric material surrounded by a material selected to be protection from outdiffusion and a source of a film thickness cap that is to form over the conductor metal and/or serve as a catalytic layer for electroless selective deposition of a CoWP capping.

1 Claim, 1 Drawing Sheet

U.S. PATENT DOCUMENTS

| | | | |
|---|---|---|---|
| 6,265,779 B1 * | 7/2001 | Grill et al. | 257/759 |
| 6,303,505 B1 * | 10/2001 | Ngo et al. | 438/687 |
| 6,358,832 B1 * | 3/2002 | Edelstein et al. | 438/612 |
| 6,395,607 B1 * | 5/2002 | Chung | 438/312 |
| 6,515,367 B1 * | 2/2003 | Bernard et al. | 257/758 |
| 6,521,523 B2 * | 2/2003 | Lee et al. | 438/633 |
| 6,528,409 B1 * | 3/2003 | Lopatin et al. | 438/618 |
| 6,627,557 B2 * | 9/2003 | Seta et al. | 438/717 |
| 6,645,853 B1 * | 11/2003 | Ngo et al. | 438/637 |
| 6,649,522 B2 * | 11/2003 | Farrar | 438/687 |
| 6,723,600 B2 * | 4/2004 | Wong et al. | 438/244 |
| 6,730,594 B2 * | 5/2004 | Noguchi et al. | 438/653 |
| 6,743,310 B1 * | 6/2004 | Ngo | 148/525 |
| 6,753,250 B1 * | 6/2004 | Hill et al. | 438/637 |
| 6,764,951 B1 * | 7/2004 | van Ngo | 438/687 |
| 6,790,773 B1 * | 9/2004 | Drewery et al. | 438/643 |
| 6,797,145 B2 * | 9/2004 | Kosowsky | 205/221 |
| 6,797,652 B1 * | 9/2004 | Ngo et al. | 438/687 |
| 6,815,329 B2 * | 11/2004 | Babich et al. | 438/619 |
| 6,831,003 B1 * | 12/2004 | Huang et al. | 438/627 |
| 6,836,017 B2 * | 12/2004 | Ngo et al. | 257/751 |
| 6,841,479 B2 * | 1/2005 | Cherian et al. | 438/690 |
| 6,849,923 B2 * | 2/2005 | Seta et al. | 257/635 |
| 2001/0030366 A1 * | 10/2001 | Nakano et al. | 257/758 |
| 2002/0053741 A1 * | 5/2002 | Iwasaki et al. | 257/762 |
| 2002/0056879 A1 * | 5/2002 | Wieczorek et al. | 257/368 |
| 2002/0098681 A1 * | 7/2002 | Hu et al. | 438/626 |
| 2002/0132471 A1 * | 9/2002 | Engel et al. | 438/639 |
| 2002/0175362 A1 * | 11/2002 | McTeer | 257/306 |
| 2003/0001240 A1 * | 1/2003 | Whitehair et al. | 257/638 |
| 2003/0087513 A1 * | 5/2003 | Noguchi et al. | 438/627 |
| 2003/0111730 A1 * | 6/2003 | Takeda et al. | 257/758 |
| 2003/0116439 A1 * | 6/2003 | Seo et al. | 205/125 |
| 2003/0134505 A1 * | 7/2003 | Dalton et al. | 438/637 |
| 2004/0084773 A1 * | 5/2004 | Johnston et al. | 257/751 |
| 2004/0113279 A1 * | 6/2004 | Chen et al. | 257/774 |
| 2004/0147117 A1 * | 7/2004 | Ngo et al. | 438/687 |
| 2004/0157425 A1 * | 8/2004 | Catabay et al. | 438/597 |
| 2004/0238965 A1 * | 12/2004 | Iwasaki et al. | 257/762 |
| 2005/0037604 A1 * | 2/2005 | Babich et al. | 438/619 |
| 2005/0082674 A1 * | 4/2005 | Seta et al. | 257/758 |
| 2005/0158985 A1 * | 7/2005 | Chen et al. | 438/629 |

* cited by examiner

FORMATION OF ALIGNED CAPPED METAL LINES AND INTERCONNECTIONS IN MULTILEVEL SEMICONDUCTOR STRUCTURES

FIELD OF THE INVENTION

The invention is in the field of the use of a metal such as copper (Cu) that may exhibit diffusion and electromigration properties as the metal conductor in lines and interconnections in semiconductor integrated circuits and in particular to the formation of conductors of such material in such integrated circuits within a dielectric material and with a self aligned metal capping layer.

BACKGROUND OF THE INVENTION AND RELATION TO THE PRIOR ART

The technology for interconnections that are to serve as vias, lines and other patterns and interconnects in integrated circuit and semiconductor chip structures is well developed in the art. In these structures multilevel wiring patterns are embedded in a dielectric material with wiring patterns and vias being separated by dielectric materials with different dielectric properties. Materials such as copper (Cu) are receiving attention in the art as having the potential of being able to improve performance by reducing conductor resistance. However; under the physical conditions of ever smaller dimension and increasing current, driven by the desire for increasing performance, the properties of diffusion and electromigration of such materials, are exhibiting difficult to solve contamination and leakage control problems and reliability issues.

Protective layers, commonly called by such terminology as "liners", "barriers" or "caps" are being employed in efforts to limit outdiffusion and electromigration. However, any protective materials also have to have good adherence to the various other dielectric materials in the structure.

At the present state of the art; the problems are addressed, in one solution, by using, for copper conductor lines on a silicon substrate using silicon dioxide as the interconnect dielectric material, and the material silicon nitride as the cap material. However the presently relied on silicon nitride material, while having the desired high resistivity properties also has a relatively high dielectric constant of 7 to 8 which operates to increase the effective dielectric constant of the structure (Keff) and may also detrimentally affect the intralevel capacitance.

In another solution; also directed to the diffusion and electromigration problems for the material Cu, the desired results are achieved including the further ability to be able to select a capping material that maintains the desired low (Keff) established by the surrounding dielectric material. That technology is described in application Ser. No. 09/361,573 filed Jul. 27, 1999, of Hu et al, and is assigned to the assignee of this application. In that technology a self aligned metal cap is produced in a two step procedure involving Cobalt Tungsten Phosporous (CoWP) deposition. The deposited material covers and protects the top copper surface while achieving the desired adhesion in the structure and to serve as an impedance to electromigration.

As further progress in the art is sought, low dieletric constant (low k) intermetal dilectric materials appear to have the more promising properties A need is present for a simpler procedural approach in integrated circuit technology wherein a conductor material such as Cu is protected from the effects of electromigration and diffusion yet can be positioned in a selectably low Keff dielectric structure.

SUMMARY OF THE INVENTION

In integrated circuit technology; a conductive element of an electromigration and diffusion sensitive metal such as copper and processing procedure therefore is provided, wherein, at a planarized chemical mechanical processed interfacing surface, the metal of the conductive element is positioned in a selectable K eff dielectric material. The metal is surrounded by a material having properties that resist diffusion of atoms out of the metal and serves as a source of a film thickness cap that is to form over the metal. The cap is to provide environmental protection and catalytic availability for use in further processing. The technology of the invention provides an intermediate conductive element product and method of manufacture that can be used as a wiring conductor or interconnect in many semiconductor integrated structures.

The conductive element is fabricated by forming an accommodating trench in a to be chemical-mechanical processed (CMP) interface surface, in a selectable, preferably (low K) dielectric. The trench is lined with a region made up of a layer or layers of a material or materials capable of controlling out diffusion from the metal into the preferably (low K) dielectric material and is further capable of providing a source for a diffusant that when diffused to the surface of the metal by an operation such as annealing forms a self aligned protective cap over the metal. The portion of the trench inside the lining is filled with the metal. An annealing temperature cycle is applied to the metal in the lined trench structure in forming the protective cap. The structure of the conductive element may then be planarized along the CMP planarization surface to residual remove any liner material and any excess metal material above the planar surface. The dielectric member can, if desired, be eroded away from the side away from the planar surface to expose the bottom of the trench for further contacting.

DESCRIPTION OF THE INVENTION

At the present state of the art, major sources of problems in the development of integrated circuits with diffusion and electromigration sensitive metals, such as copper, as wiring conductors and interconnects, are arising from contamination at the supporting dielectric interface by the diffusion out of the metal into the dielectric, and from reaction with other materials at the metal to next stage interface.

Figure 1:
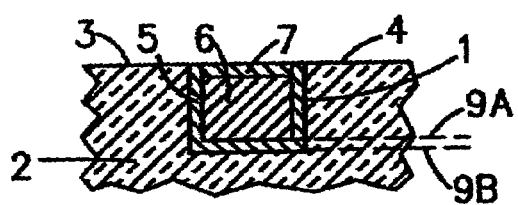
FIG. 1 is a cross sectional depiction of the capped diffusion-electromigration protected conductive element of the invention.

Referring to FIG. 1 there is shown a cross sectional depiction of the diffusion-migration protection conductive element of the invention. In FIG. 1, in a trench 1 extending into a dielectric 2, that extends below a planar chemical mechanical processed (CMP) planarized surface 3, the diffusion-electromigration protection conductive element of the invention 4 is positioned within a liner 5 along the sides and bottom of the trench 1. The copper conductor 6 in the liner 5 has a cap 7 aligned with the outside side surfaces 8 of the liner 5 and can be processed flush as the (CMP) planarized surface 3. In further use, where desired, the dielectric material 2 may be further CMP processed, from below so as to expose the bottoms of the conductors 6 in a to be planarized surface shown dotted as 9A for the conductors being exposed and 9B with a cap corresponding to cap 7.

Referring to FIGS. 2A-2G partial product depictions of the structure are provided at illustrative fabrication steps in the formation of the diffusion-migration protected conductor element of the invention using as the conductor the metal copper (Cu), and wherein reference numerals corresponding to those used in the earlier figures are employed where appropriate.

Figure 2A:
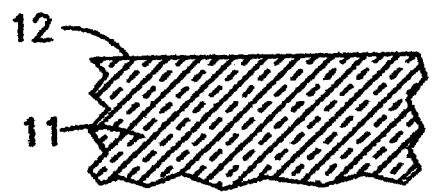
FIGS. 2A-2G illustrate partially fabricated structure at several of the processing steps in forming the capped conductive element of the invention.

Referring to FIGS. 1 and 2 beginning at FIG. 2A, a layer 11 of a dielectric material 2; such as a member from the group of SiO2, SILK, FSG, SiCOH and Si based low K dielectrics commonly composed of Si, C, O, and H, and having trademarks such as CORAL and BlackDIAMOND or the like; has been deposited on a substrate of a material such as an oxide of silicon, to a depth of about 1000-10000 angstroms for example, which is about the order of or slightly greater than the design height of the to be formed conductor 6. The surface 12 is left exposed. At this point there is flexibility in selection of the properties of the dielectric material 2 used in the layer 11 so that a low K dielectric can be chosen.

Figure 2B:
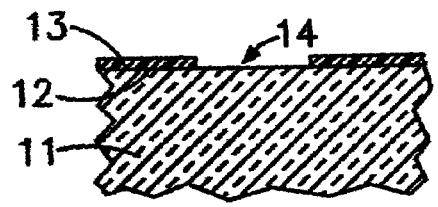

Referring to FIG. 2B, the exposed surface 12 is lithographically covered with a mask material 13 so that an area 14 is left exposed for manufacturing operations. The mask material 13 is to be resistant to any desired erosion operation of the dielectric 11, such as chemical or reactive ion etching, through the area 14.

Figure 2C:
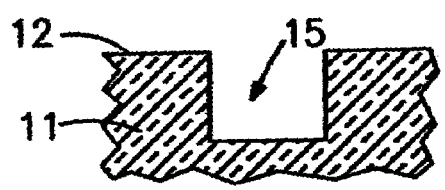

Referring to FIG. 2C, the illustration depicts the formation of a trench 15 in the dielectric layer 11 that has been formed such as by a chemical or reactive ion etch through the surface 12 to an about 1000-10000 angstrom depth which is about the order of or slightly greater than the design height of the to be formed conductor 6.

Figure 2D:
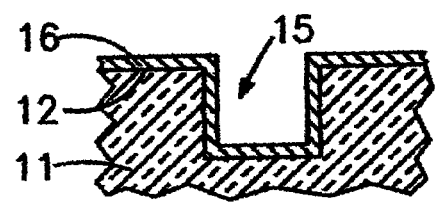

In FIG. 2D, a lining region labeled element 16 may be deposited in the trench 15 by such techniques as physical vapor deposition (PVD) i.e., sputtering or the like, chemical vapor deposition (CVD), atomic layer deposition (ALD), electroless or electrolytic deposition. The region 16 is to cover the sides and bottom of the trench 15 and initially is permitted to cover the surface 12. The element 16 may be one or more separate layers, an alloy or a phase in structure and may be formed as an example by a binary layer composed of tungsten (W) with ruthenium (Ru). Alternative combinations may be TaN/Ta/Ru, TiW/Ru, TiN/Ru. The diffusion source property of the material in region 16 produces a metal cap which can also serve a catalytic function in the structure. The property imparting ingredient is the Ru which can be replaced by elements such as Pd, Rh, Co, Pt, Ir and Ag.

The functions of the region 16 are to provide an outdiffusion and electromigration inhibiting capability with respect to the conductor metal to be included in the trench 15 and to serve as a source of a diffusant element that is to later diffuse out of the region 16 through the to be provided conductor metal and then to serve as a self aligned cap thereover. The lining region layer 16 may be selected from the following:

For stacked liners A/B: A may be selected from W, Ta or Ti; their nitrides and silicides or combinations thereof and B may be selected from Pd, Rh, Co, Pt, Ir, Ru, and Ag where the thickness of the B layer is <100 A.

For alloy liners A(B) the above ingredient relationships hold and the proportion of B in the alloy is <75%. The total lining region element 16 thickness is in the range of about 30-300 angstroms for a line width spacing of about 0.1 micrometers.

Figure 2E:
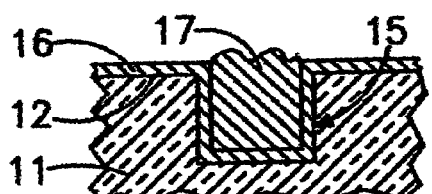

Referring to FIG. 2E a filling operation is illustrated as having taken place in which the open portion of the liner 16 within the trench 15 is filled using a deposition operation of the conductor material labeled element 17. The deposition operation may be a standard in the art technique such as electrolytic or electroless plating. Where the conductor metal is selected to be Cu a seed may or may not be needed in activating any electrolytic plating operation. The deposition operation of the conductor material 17 fills the opening 18 in the lined 16 trench 15 and there may be an extended region extending above the surface of the portion of the liner 16.

Figure 2F:
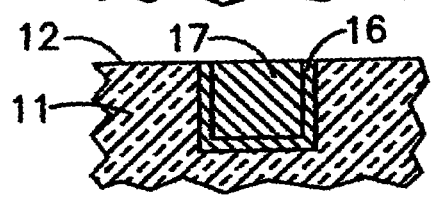

In connection with FIG. 2F a planarization operation has taken place wherein using such techniques as chemical-mechanical polishing all material has been removed down to the surface 12 leaving the trench 15 containing the liner 16 which in turn is filled with the conductor material 17 all flush with the surface 12.

Figure 2G:
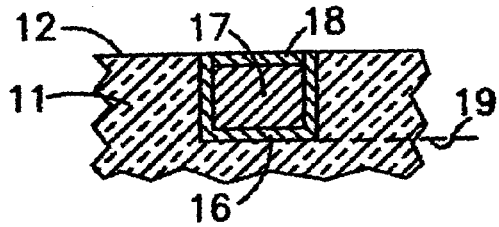

Referring to FIG. 2G the structure as depicted in FIG. 2F is subjected to an annealing heat cycle that operates to diffuse a capping material, such as Ruthenium that has been included in the liner 16 through the conductor material 17 that is filling open portion of the trench 15 to the surface 12 forming thereby a cap 18 at the surface that is self aligned with the margins of the liner 16 at the surface 12. The cap 18 can be about 5-50 angstroms in thickness to be sufficient for environmental protection or for service as a catalyst for an electro or electroless plating operation of the order of 50-500 angstroms in thickness.

The intermediate product depicted in FIG. 2G can be used as is for electrical lines at the surface 12, or through use of the cap 18 as a seed or catalyst for further capping layers or still further through erosion processing such as CMP from below the intermediate product to the line 19, shown dotted, thereby exposing the diffusion and electromigration protected and capped line or interconnect for other use.

What has been described is the technology of providing a diffusion and electromigration protected conductive element in a dielectric with a self aligned cap where the conductor in the dilectric is surrounded by a material that is resistant to out diffusion and serves as a source of a capping material that can diffuse to the cap position.

What is claimed is:

1. An integrated circuit conductive metal susceptible to electromigration, said metal positioned in a trench in a planar surface of a dielectric, said dielectric being formed of at least one material taken from the group taken from the group of monomeric $SiO_2$ based compounds selected from SiCOH and SiLK materials, said conductive metal being copper and surrounded in said trench by a lining of a material that inhibits out-diffusion from the electromigration susceptible metal, said lining being an alloy or liner stack comprised of at least one elements from groups A and B, where A is chosen from W, Ta, Ti, their nitrides and silicides; and where B is chosen from Ru, Rh, Pd, Pt, Ag, Co and Ir, said metal and said liner in said trench being covered by a self aligned cap formed from at least one member of the group of Ru, Pd, Rh, Ir, Ag, Pt and Co, and said cap comprising said material forming said liner, said liner per se serving as the source of material for said cap.

* * * * *